(12) United States Patent
Quinones et al.

US006861278B2

(10) Patent No.: US 6,861,278 B2
(45) Date of Patent: Mar. 1, 2005

(54) METHOD AND APPARATUS FOR UNDERFILLING SEMICONDUCTOR DEVICES

(75) Inventors: Horatio Quinones, Vista, CA (US); Liang Fang, San Diego, CA (US); Thomas Laferl Ratledge, San Marcos, CA (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 10/408,464

(22) Filed: Apr. 7, 2003

(65) Prior Publication Data

US 2003/0194833 A1 Oct. 16, 2003

Related U.S. Application Data

(60) Provisional application No. 60/371,826, filed on Apr. 11, 2002.

(51) Int. Cl.$^7$ .............................................. H01L 21/44
(52) U.S. Cl. ........................ 438/51; 438/126; 438/127; 257/778; 257/787
(58) Field of Search .......................... 438/51, 126–127; 257/778, 787

(56) References Cited

U.S. PATENT DOCUMENTS

| | | | |
|---|---|---|---|
| 4,049,244 A | 9/1977 | Hedrich | 259/185 |
| 4,279,360 A | 7/1981 | Hauser | 222/1 |
| 5,147,660 A | 9/1992 | Steindorf | 425/148 |

(List continued on next page.)

FOREIGN PATENT DOCUMENTS

| | | | |
|---|---|---|---|
| EP | 1 096 559 A2 | 5/2001 | H01L/21/56 |
| GB | 2156247 A | 10/1985 | B05C/3/09 |
| WO | WO 97/13586 | 4/1997 | B05C/11/10 |

OTHER PUBLICATIONS

European Patent Office, *International Search Report*, Jul. 29, 2003 (4 pages).
Derwent Information Ltd., *Automated flow–time measurement apparatus for flip–chip underfill*, Abstract, Copyright 1999 (2 pages).
Wilhelm Hedrich Vacuumanlagen GmbH & Co. KG, Hedrich "On–The–Fly" Degassi, Wilhelm Hedrich Vacuumanlagen Sales Brochure, date unknown (2 pages).
Chris Lawing, Camelot Systems Inc., *Preventing Voids in uBGA® Packages*, Chip Scale Review, Mar. 1998, (pp. 48–51).
Ron Iscoff, *Pushing the Envelope for the Next Generation of CSPs*, Chip Scale Review, Mar. 1998 (pp. 25–29).
New CSP Dispensing Systems Offer Fast, Void–Free Encapsulation and Craig Mitchell, Tessera Inc., *Recent Advances in CSP Encapsulation*, Chip Scale Review, Mar. 1998 (7 pages).

(List continued on next page.)

*Primary Examiner*—Luan Thai
(74) *Attorney, Agent, or Firm*—Wood, Herron & Evans, L.L.P.

(57) ABSTRACT

A method and apparatus for underfilling a gap between a multi-sided die and a substrate with an encapsulant material. The die and/or the substrate is heated non-uniformly by a heat source to generate a temperature gradient therein. The heated one of the die and the substrate transfers heat energy in proportion to the temperature gradient to the encapsulant material moving in the gap. The differential heat transfer steers, guides or otherwise directs the movement of the encapsulant material in the gap. The temperature gradient may be established with heat transferred from the heat source to the die and/or the substrate by conduction, convection, or radiation. The temperature gradient may be dynamically varied as the encapsulant material moves into the gap.

53 Claims, 6 Drawing Sheets

U.S. PATENT DOCUMENTS

| | | | | |
|---|---|---|---|---|
| 5,203,076 | A | | 4/1993 | Banerji et al. ................. 29/840 |
| 5,218,234 | A | | 6/1993 | Thompson et al. .......... 257/787 |
| 5,382,394 | A | | 1/1995 | Terhardt ..................... 264/40.7 |
| 5,385,869 | A | | 1/1995 | Liu et al. ..................... 437/209 |
| 5,409,523 | A | | 4/1995 | Haeuser ....................... 95/260 |
| 5,529,212 | A | | 6/1996 | Terhardt ......................... 222/1 |
| 5,591,252 | A | | 1/1997 | Haeuser ........................ 95/260 |
| 5,659,952 | A | | 8/1997 | Kovac et al. .................. 29/840 |
| 5,670,203 | A | | 9/1997 | Terhardt et al. ............... 427/58 |
| 5,710,071 | A | | 1/1998 | Beddingfield et al. ....... 438/108 |
| 5,766,982 | A | * | 6/1998 | Akram et al. .................. 438/51 |
| 5,817,544 | A | | 10/1998 | Parthasarathi ............... 438/123 |
| 5,817,545 | A | | 10/1998 | Wang et al. ................. 438/127 |
| 5,866,442 | A | | 2/1999 | Brand ......................... 438/108 |
| 5,932,254 | A | | 8/1999 | Mitchell et al. ............. 425/117 |
| 5,935,375 | A | | 8/1999 | Nakazawa et al. ........... 156/356 |
| 5,942,798 | A | | 8/1999 | Chiu ........................... 257/737 |
| 5,998,242 | A | | 12/1999 | Kirkpatrick et al. ......... 438/127 |
| 6,000,924 | A | | 12/1999 | Wang et al. ................. 425/125 |
| 6,011,312 | A | * | 1/2000 | Nakazawa et al. ........... 257/778 |
| 6,048,656 | A | | 4/2000 | Akram et al. ................ 430/118 |
| 6,080,605 | A | | 6/2000 | Distefano et al. ............ 438/126 |
| 6,179,598 | B1 | | 1/2001 | Brand ......................... 425/110 |
| 6,220,503 | B1 | | 4/2001 | Cox et al. .................... 228/265 |
| 6,232,145 | B1 | | 5/2001 | Brand ......................... 438/106 |
| 6,255,142 | B1 | | 7/2001 | Babiarz et al. .............. 438/126 |
| 6,264,094 | B1 | | 7/2001 | Cox et al. .............. 228/180.21 |
| 6,498,054 | B1 | * | 12/2002 | Chiu et al. ................... 438/108 |

OTHER PUBLICATIONS

Mark J. Norris, *The Dispensing Process in Advanced Electronic Component Manufacturing Of Ball Grid Arrays, Flip Chip & Chip Scale Packages*, Pan Pacific Microelectronics Symposium, Feb. 10–13, 1998 (pp. 179–185).

Verfahrenstachnik Hübers GmbH, *Vacuum Casting Resin Plants*, Verfahrenstechnik Hübers GmbH Sales Brochure, date unknown (6 pages).

Chris Lawing, Camelot Systems, Inc., *Vacuum Dispensing of Encapsulants for uBGA Manufacturing*, Electronic Packaging & Production, Feb. 1998 (3 pages).

Wilhelm Hedrich Vacuumanlagen GmbH & Co. KG, *Vacuum Shot Dosing Equipment*, Wilhelm Hedrich Vacuumanlagen Sales Brochure, date unknown (pp. 1–40).

Wilhelm Hedrich Vacuumanlagen GmbH & Co. KG, *Vacuum Technology—Worldwide—for Tomorrow's Innovation*, Wilhelm Hedrich Vacuumanlagen Sales Brochure, date unknown (6 pages).

* cited by examiner

METHOD AND APPARATUS FOR UNDERFILLING SEMICONDUCTOR DEVICES

The present application claims the filing benefit of U.S. Provisional Application Ser. No. 60/371,826, filed Apr. 11, 2002, the disclosure of which is hereby incorporated herein by reference in its entirety.

FIELD OF THE INVENTION

This invention relates generally to liquid dispensing methods and apparatus used in semiconductor package manufacturing and, more particularly, to the underfilling of one or more semiconductor dies carried by a substrate.

BACKGROUND OF THE INVENTION

In the microelectronics industry, a die carrying an integrated circuit is commonly mounted on a package carrier, such as a substrate, a circuit board or a leadframe, that provides electrical connections from the die to the exterior of the package. In one such packaging arrangement called flip chip mounting, the die includes an area array of electrically-conductive contacts, known as bond pads, that are electrically connected to corresponding area array of electrically-conductive contacts on the package carrier, known as solder balls or bumps. Typically, the solder bumps are registered with the bond pads and a reflow process is applied to create electrical connections in the form of solder joints between the die and the package carrier. The process of flip chip mounting results in a space or gap between the die and the package carrier.

The die and the package carrier are usually formed of different materials having mismatched coefficients of coefficient of thermal expansion. As a result, the die and the package carrier experience significantly different dimension changes when heated that creates significant thermally-induced stresses in the electrical connections between the die and the package carrier. If uncompensated, the disparity in thermal expansion can result in degradation in the performance of the die, damage to the solder joints, or package failure. As the size of the die increases, the effect of a mismatch in the coefficient of thermal expansion between the die and the substrate becomes more pronounced. In stacked die packages, the mismatch in coefficient of thermal expansion between the die laminate and the package may be even greater than in single die packages. The failure mechanism in stacked die packages may shift from solder joint damage to die damage.

To improve the reliability of the electrical connections in flip chip package assemblies, it is common in the microelectronics industry to fill the gap between the die and the package carrier with an encapsulant material. Underfilling with encapsulant material increases the fatigue life of the package and improves the reliability of the electrical connections by reducing the stress experienced by the electrical connections during thermal cycling or when the die and the package carrier have a significant temperature differential. The encapsulant material also isolates the electrical connections from exposure to the ambient environment by hermetically sealing the gap and lends mechanical strength to the package assembly for resisting mechanical shock and bending. The encapsulant material further provides a conductive path that removes heat from the die and that operates to reduce any temperature differential between the die and substrate. As a result, underfilling with encapsulant material significantly increases the lifetime of the assembled package.

Various conventional underfilling methods are used to introduce the encapsulant material into the gap between the die and the substrate. One conventional method relies surface tension wetting or capillary action to induce movement of a low-viscosity encapsulant material with strong wetting characteristics from a side edge into the gap. According to this method, encapsulant material is dispensed as an elongated single line, L-shaped or U-shaped bead adjacent to one, two or three contiguous side edges of the die, respectively, and capillary forces operate to attract the encapsulant material into the gap. Typically, the viscosity of the encapsulant material is reduced and the flow rate increased by pre-heating the substrate in the vicinity of the die to a uniform, steady-state temperature between about 40° and about 90°, before the encapsulant material is dispensed onto the substrate. The underfill material is subsequently cured after the electrical connections have been fully encapsulated.

With reference to FIG. 1, a time sequence for a typical underfilling operation relying on capillary action is shown. Isochronal contour lines 11 represent the advance of the leading edge or wave front of the encapsulant material 10 moving into the gap separating a die 12 from a substrate 14. Initially, the encapsulant material 10 is dispensed as an L-shaped bead onto the substrate 14 adjacent to contiguous side edges of the die 12 and is attracted into the gap by capillary forces. As time progresses, the wave front of encapsulant material 10 advances substantially diagonally, as indicated by arrow 16, through the gap. Drag causes the flow rate to diminish with increasing time as indicated by the reduced separations between adjacent pairs of contour lines 11 and, as the underfilling operation nears completion, the advance rate of the wave front of encapsulant material slows dramatically.

For larger size dies and smaller gap dimensions, the time necessary to underfill using conventional capillary underfilling methods becomes longer because of the longer fluid path of the liquid encapsulant and shear rates. As a result, throughput diminishes and underfilling operations become less cost effective. One way of enhancing the velocity of the encapsulant material is to perform a forced underfill that relies upon, for example, vacuum assistance to enhance the fill rate and the quality of filling. Vacuum-assisted underfilling utilizes a pressure differential created across a bead of encapsulant material to draw the encapsulant material into the gap. Regardless of the underfilling method, it is important that voids are not formed in the encapsulant material. Voids may result in corrosion and undesirable thermal stresses that degrade performance or adversely effect the reliability of the package assembly.

It would therefore be desirable to provide a manner of underfilling the gap formed between a die and a package carrier that prevents the occurrence of voids between the die and the package carrier and that reduces the time required to perform an underfilling operation.

SUMMARY OF THE INVENTION

The present invention overcomes the foregoing and other shortcomings and drawbacks of underfill apparatus and methods heretofore known. While the invention will be described in connection with certain embodiments, it will be understood that the invention is not limited to these embodiments. On the contrary, the invention includes all alternatives, modifications and equivalents as may be included within the spirit and scope of the present invention.

Generally, the invention relates to a method and apparatus for underfilling a gap between a multi-sided die, which may be a semiconductor device, and a package carrier, such as a substrate, to encapsulate a plurality of electrical connections formed therebetween. The die may comprise a flip chip package having a flip chip mounted to a substrate with a plurality of electrical connections formed in the gap between opposed surfaces of the flip chip and the substrate.

According to the principles of the present invention, an apparatus is provided for underfilling the gap between the multi-sided die and the substrate with a dispenser operative for dispensing an encapsulant material adjacent to at least one side edge of the die. The apparatus includes a heat source operative to transfer heat energy to first and second regions of one of the die and the substrate so that said first and second regions are heated to respective first and second temperatures. The first temperature differs from the second temperature so as to non-uniformly transfer heat to the encapsulant material moving in the gap between the multi-sided die and the substrate.

According to the principles of the present invention, a method is provided for underfilling the gap between the multi-sided die and the substrate. The method includes heating at least one of the die and the substrate by either conduction, convection or radiation to generate a temperature gradient on the heated one of the die and substrate. An encapsulant material is dispensed adjacent to at least one side edge of the die and subsequently moved into the gap for encapsulating the plurality of electrical interconnections. Heat energy is transferred non-uniformly from the heated one of the die and substrate to the moving encapsulant material in a pattern determined by the temperature gradient for selectively varying the flow rate of the moving encapsulant material in the gap. In one aspect of the invention, the individual temperatures of the temperature gradient may be varied dynamically as the encapsulant material flows into the gap.

From the foregoing summary and the detailed description to follow, it will be understood that the invention provides a unique and effective method and apparatus for underfilling the gap between a die, such as a flip chip, and a substrate. The invention is particularly advantageous in applications in which the gap between the die and the substrate is small and in applications utilizing relatively large dies with a large space to underfill. In these situations, differential or non-uniform heating of either the die and/or the substrate according to the principles of the present invention augments the capillary action or forced (e.g., vacuum-assisted) capillary action normally relied upon to move the underfill material into the gap for fully encapsulating the electrical connections with a lower incidence of void formation. The augmentation provides a more uniform leading edge or wave front for encapsulant material advancing in the gap by selectively lowering the viscosity of the material in the regions of differing temperature so as to vary the flow rate of the material and the directionality of the material as it moves within the gap.

The present invention improves the durability and reliability of electronic components that require an underfill encapsulant material in the gap between a die mounted on a substrate. The present invention also reduces the time required to effectively and reliably underfill encapsulant material within the gap between the die and the substrate. The present invention improves upon the overall throughput of underfilling process while at the same time accommodating the need for flexibility and also accommodating multiple different chip sizes, reduced gap dimensions, and the various types of encapsulant material used in the industry.

The above and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF THE PREFERRED EMBODIMENT

Figure 1:
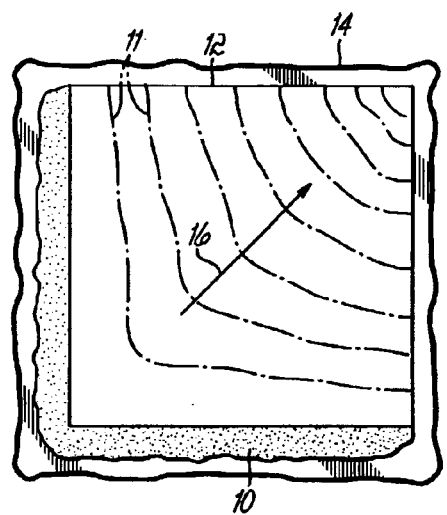
FIG. 1 is a schematic view showing an underfilling operation performed with capillary action and with the substrate heated to a uniform temperature in accordance with prior art practices.
Figure 2:
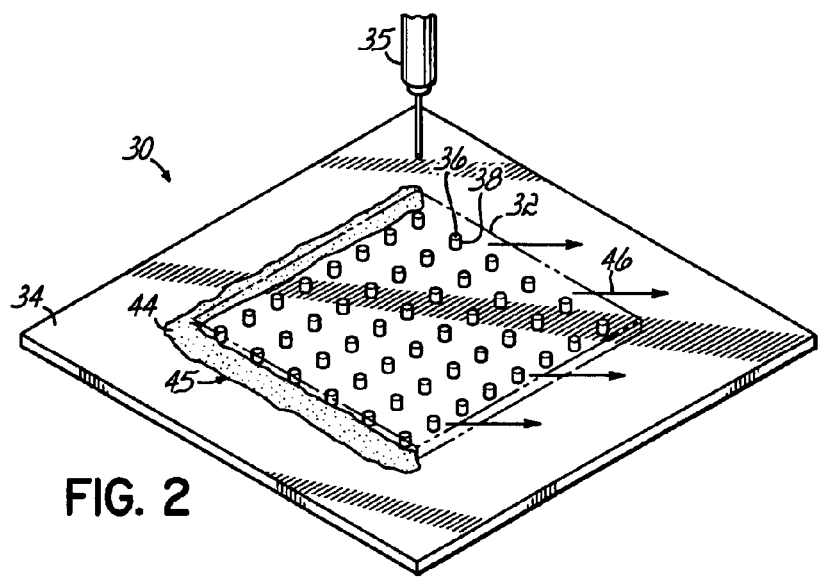
FIG. 2 is a schematic perspective view of a package assembly of a die, shown in phantom, and substrate during an underfilling operation.
Figure 3:
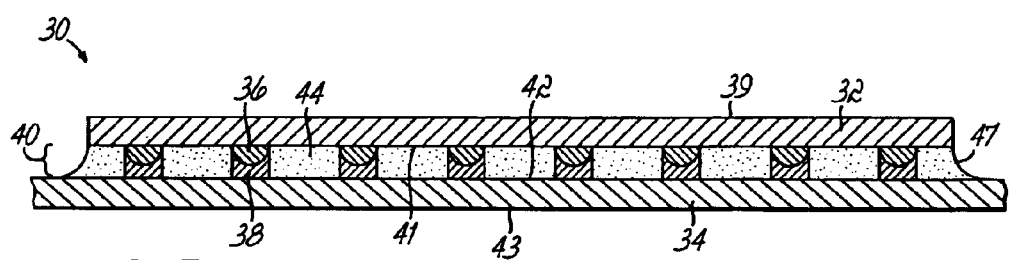
FIG. 3 is a schematic side view of a package assembly of a die and substrate following an underfilling operation.

With reference to FIGS. 2 and 3, a semiconductor device package 30 consisting of a die 32 mounted on a package carrier or substrate 34 in a flip chip mounting arrangement is shown. As those skilled in the art will appreciate, substrate 34 may comprise an organic or ceramic substrate material such as a printed circuit board, a flip chip multi-chip module or a flip chip carrier. The die 32 is electrically and mechanically connected to the substrate 34 through an area array of solder bumps 36 on the underside of the die 32 that are registered or aligned with a corresponding area array of solder pads 38 on the substrate 34. Upon heating, the solder pads 38 on the substrate reflow and physically connect with the solder bumps 36 of die 32 to provide mechanical, thermal and electrical coupling therebetween in the form of solder joints. With this mounting arrangement, a gap 40 is formed between a contact side 41 of the die 32 and a top surface 42 of the substrate 34.

The gap 40 is filled with an encapsulant material 44, such as a liquid epoxy, according to the principles of the present invention. Various different encapsulant materials are suitable for use in the invention, including but not limited to a line of encapsulants commercially available under the HYSOL® tradename from Loctite Corp (Rocky Hill, Conn.). As illustrated in FIG. 2, encapsulant material 44 is provided from an underfill dispenser 35 as an L-shaped bead 45 dispensed onto the surface of the substrate proximate to the gap 40 and on two contiguous sides of the die 32. Although the present invention is described for use with an L-shaped bead, the principles of the invention are applicable to any bead shape, including a single line of encapsulant material 44 disposed along one side edge of die 32, a U-shaped bead of encapsulant material 44 disposed along three side edges of die 32, or other dispensing patterns. The amount of encapsulant material 44 in bead 45 depends upon the desired fillet volume and the under-die volume determined by the size of die 32 and the height tolerances of the solder junctions created between bumps 36 and pads 38.

The underfill dispenser 35 may take any form readily known in the art for dispensing liquid encapsulant or underfill material in a desired pattern relative to the die 32. One suitable underfill dispenser 35 is the DP-3000 pump commercially available from Nordson Asymtek (Carlsbad, Calif.).

With continued reference to FIGS. 2 and 3, the encapsulant material 44 flows or moves in the gap 40, as indicated generally by arrows 46, under capillary action or with forced assistance. After flow ceases (FIG. 3), the encapsulant material 44 fully encapsulates all of the electrical interconnections provided by the solder junctions and a fillet 47 is formed along the side edges of the die 32. The encapsulant material 44 is cured after the conclusion of the underfilling operation.

According to the principles of the present invention, a temperature gradient is established in the die 32, the substrate 34, or both the die 32 and substrate 34 for transferring heat to the encapsulant material moving into the gap 40 between the underside 41 of the die 32 and the top surface 42 of the substrate 34. To establish the temperature gradient, heat, also referred to herein as heat energy, may be transferred in a spatially non-uniform, non-equal or otherwise inhomogeneous manner from a heat source to the die 32 and/or the substrate 34 by contact heating or by non-contact heating. Heat from the die 32 and/or the substrate 34 is subsequently transferred by conduction to the encapsulant material advancing through or moving in the gap 40. The transferred heat elevates the temperature of the encapsulant material 44 in the gap 40 so as to reduce the temperature-dependent viscosity and to thereby increase the uniformity of the leading edge or wave front of the advancing encapsulant material 44. The non-uniform heat transfer varies the flow of the encapsulant material 44 by altering the flow rate and the directionality of the movement in the gap 40. The principles of the present invention may be incorporated into any conventional underfill dispensing system, such as the M-2020, the X-1020, M-620 and C-720 underfill dispensing systems commercially available from Nordson Asymtek (Carlsbad, Calif.).

Figure 4:
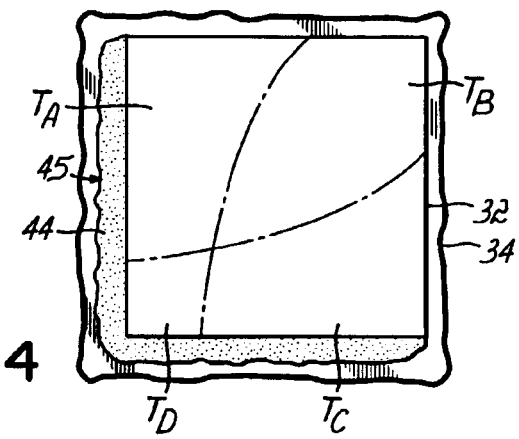
FIG. 4 is a diagrammatic view of temperature zones created in the gap between a die and a substrate according to an embodiment of the present invention.

With reference to FIG. 4 and in which like reference numerals refer to like features in FIGS. 2 and 3, the temperature gradient may include a plurality of, for example, four spatially-distributed temperature zones $T_A$, $T_B$, $T_C$ and $T_D$ for promoting the flow of encapsulant material 44 from an L-shaped elongated bead dispensed onto the substrate 34 adjacent to two side edges of the die 32. In each of the temperature zones $T_A$, $T_B$, $T_C$ and $T_D$, heat is transferred to the encapsulant material 44 in the gap 40 (FIG. 3) between the die 32 and the substrate 34 in an amount sufficient to raise the temperature of the encapsulant material 44 to a characteristic temperature corresponding to the heat energy transferred within each zone. The characteristic temperature of each of the temperature zones $T_A$, $T_B$, $T_C$ and $T_D$ may be constant or steady-state, as in FIGS. 5–12, or may be modulated or non-steady-state, as in FIGS. 13–14. The characteristic temperature in each of the temperature zones $T_A$, $T_B$, $T_C$ and $T_D$ may be quantified by a single value or by a distribution of values having a mean or arithmetic average equal to the corresponding characteristic temperature.

The amount of heat that must be transferred by conduction from either the die 32 or the substrate 34 to the encapsulant material 44 in each of the temperature zones $T_A$, $T_B$, $T_C$ and $T_D$ to establish the associated temperature in material 44 depends upon the product of mass, specific heat, and the required temperature rise of material 44. For example, the desired temperature for volumes of the encapsulant material 44 in temperature zone $T_A$ is less than the desired temperature for other volumes of material 44 in temperature zone $T_D$ as the flow resistance or impedance in the portion of the gap associated with zone $T_A$ is less than the impedance in the portion of the gap 40 associated with zone $T_D$. The arrangement of temperature zones $T_A$, $T_B$, $T_C$ and $T_D$ may have a mirror symmetry, as illustrated in FIG. 4, or any other arrangement or configuration, including the number of zones, without limitation as required by the specific underfilling operation.

The rate of heat flow throughout the volume of encapsulant material 44 in each of the temperature zones $T_A$, $T_B$, $T_C$ and $T_D$, until equilibrated, will depend upon the thermal conductivity, the temperature difference among different portions of the encapsulant material 44, and the length and cross-sectional area of the various heat flow paths. Typically, encapsulant material 44 entering one of the temperature zones $T_A$, $T_B$, $T_C$ and $T_D$ will flow for a short distance in that zone before equilibrating thermally with other portions of material 44 equilibrated at the associated temperature of that temperature zone. It is appreciated by those of ordinary skill in the art that one or all of the die 32, the substrate 34, and the encapsulant material 44 may be preheated before the underfilling operation to reduce the time required to establish the temperature gradient. It is also appreciated by those of ordinary skill in the art that the temperature change across the boundaries between adjacent ones of the temperature zones $T_A$, $T_B$, $T_C$ and $T_D$ may be abrupt and well-defined, as depicted in FIG. 4, or less sharply-delineated so as to provide transition regions over which the temperature changes continuously.

According to the principles of the present invention, the increased flow rate and the altered directionality of the movement of the encapsulant material 44, as tailored by the non-uniform or unequal heating, enhances the throughput of the underfilling operation and reduces the occurrence of voids so as to improve the quality of the underfill. To that end, the different temperature zones $T_A$, $T_B$, $T_C$ and $T_D$ provide regions of differing temperature in which the non-uniform heat transfer guides, steers or otherwise directs the encapsulant material in the gap. It is appreciated that the non-uniform heating to provide temperature zones $T_A$, $T_B$, $T_C$ and $T_D$ may occur before dispensing the encapsulant material 44 onto the substrate 34, after dispensing the encapsulant material 44 onto the substrate 34, or the two events may be simultaneous.

Figure 5:
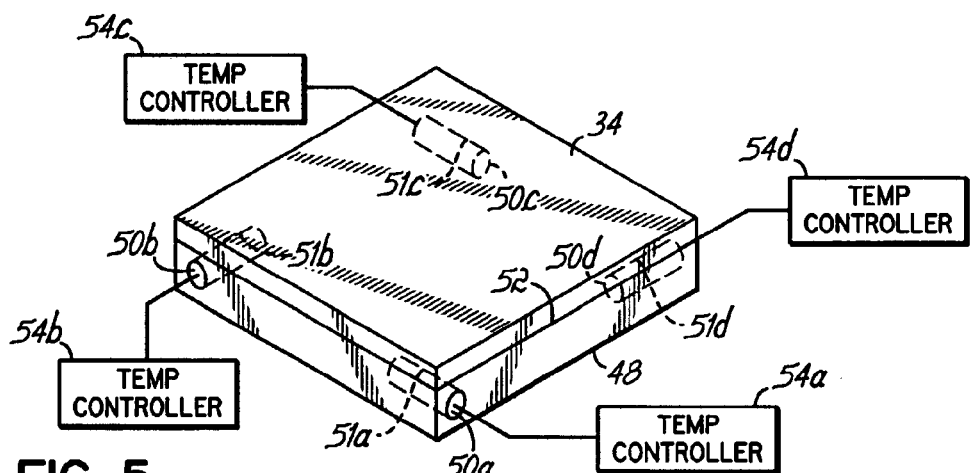
FIG. 5 is a perspective view of an embodiment of a heating block of the present invention for transferring heat by conduction to a substrate during an underfilling operation to provide the temperature zones of FIG. 4.

With reference to FIG. 5, a support plate or block 48 is shown that operates to transfer heat by conduction to the substrate 34 and, subsequently, from the substrate 34 to the encapsulant material 44 (FIGS. 2, 3) moving into the gap 40 (FIG. 3) during an underfilling operation. The support block 48 includes a plurality of, for example, four heating elements 50a–d each disposed in a corresponding one of a plurality of suitably-shaped cavities 51a–d formed in block 48. The heating elements 50a–d are arranged in the support block 48 so as to permit the establishment of the temperature zones $T_A$, $T_B$, $T_C$ and $T_D$ (FIG. 4). The heating elements 50a–d may be any structure capable of resistively converting electrical energy into heat energy and transferring the heat energy to the support block 48. Suitable heating elements 50a–d include a line of cartridge heaters commercially available under the FIREROD® tradename from Watlow Electric Manufacturing Company (St. Louis, Mo.).

An upper surface 52 of the support block 48 has rectangular dimensions similar to the rectangular dimensions of the contact surface 41 of die 32. The support block 48 is positioned so that upper surface 52 is coupled in thermal communication with a bottom surface 43 (FIG. 3) of substrate 34 and so that the upper surface 52 substantially underlies or mirrors the perimeter of the contact surface 41 of die 32. Heat is transferred by conduction from the upper surface 52 of support block 48 in areas of physical, surface-to-surface contact between with the bottom surface 43 of substrate 34. Recognizing that surfaces are not perfectly flat or smooth, it is appreciated the total surface area of contact between surfaces 43 and 52 should be significantly greater than the total surface area of non-contacting areas between surfaces 43 and 52 and adequate to provide the desired temperatures for the encapsulant material 44 in each of the temperature zones $T_A$, $T_B$, $T_C$ and $T_D$. The amount of heat transferred in each of the temperature zones $T_A$, $T_B$, $T_C$ and $T_D$ is sufficient to provide the corresponding characteristic temperature for the encapsulant material 44 moving in gap 40.

Each of the heating elements 50a–d is coupled electrically with a corresponding one of a plurality of temperature controllers 54a–d. The temperature controllers 54a–d control the electrical energy supplied to each of the heating elements 50a–d to heat corresponding portions of the support block 48 to achieve the corresponding temperature in each of the temperature zones $T_A$, $T_B$, $T_C$ and $T_D$ (FIG. 4). The temperature controllers 54a–d are any conventional device familiar to those of ordinary skill in the art that is operative to supply electrical energy to a resistive heating element.

Figure 6:
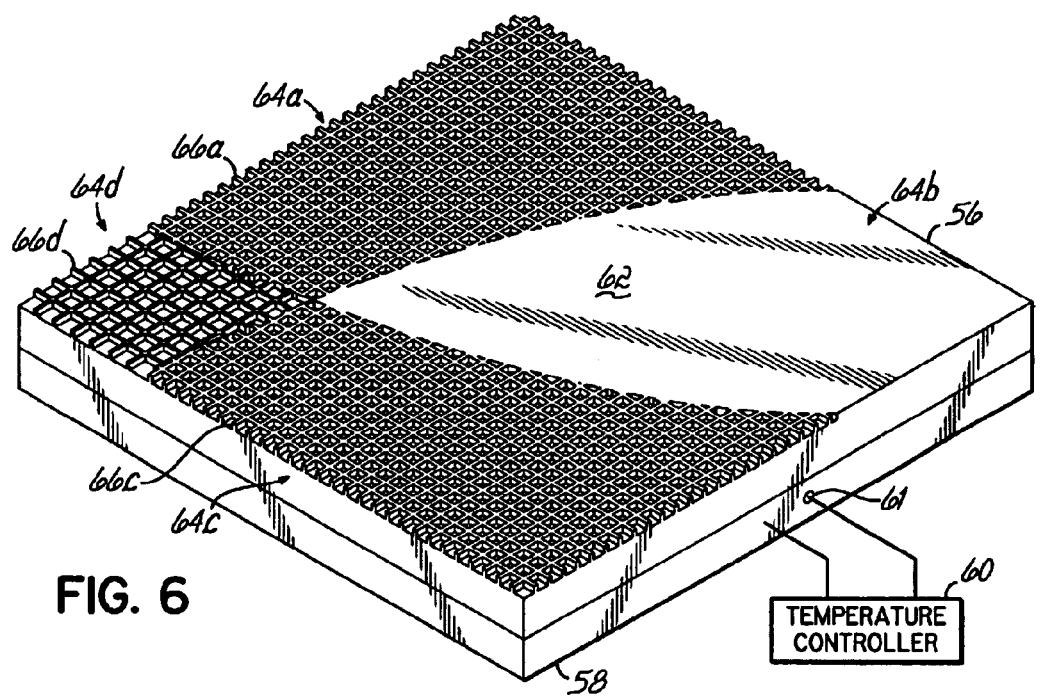
FIG. 6 is a perspective view of another embodiment of a heating block of the present invention for transferring heat by conduction to a substrate during an underfilling operation to provide the temperature zones of FIG. 4.

With reference to FIG. 6 and in accordance with another embodiment of the invention, a support plate or block 56 is shown that operates to transfer heat by conduction to the substrate 34 (not shown) and, subsequently, from the substrate 34 to the encapsulant material 44 (FIGS. 2, 3) moving into the gap 40 (FIG. 3) during an underfilling operation. The support block 56 is in good thermal contact with a heating element 58, which is controlled by a suitable temperature controller 60. A temperature sensor 61, such as a thermocouple, provides temperature information as feedback to the temperature controller 60 for use in controlling the temperature of the support block 56. Heating element 58 is conventional and suitable heating elements 58 include various thick film heaters and cast-in heaters commercially available, for example, from Watlow Electric Manufacturing Company (St. Louis, Mo.). Sufficient heat energy is transferred from the heating element 58 by conduction to the support block 56 to heat block 56 to a substantially uniform temperature.

An upper surface 62 of the support block 56 has rectangular dimensions similar to the rectangular dimensions of the contact surface 41 of die 32. The support block 56 is positioned so that upper surface 62 is coupled generally in thermal communication with the bottom surface 43 (FIG. 3) of substrate 34 and so that the upper surface 62 substantially underlies the perimeter of the contact surface 41 of die 32. Heat energy is selectively transferred from the upper surface 52 of support block 48 primarily by conduction in areas of physical contact with the bottom surface 43 of substrate 34.

According to the principles of the present invention, the upper surface 52 of support block 56 is modified so that the amount of heat energy transferred from upper surface 52 to bottom surface 43 of substrate 34 creates the temperature zones $T_A$, $T_B$, $T_C$ and $T_D$ (FIG. 4). To that end, upper surface 52 includes a plurality of four portions 64a–d each corresponding to one of temperature zones $T_A$, $T_B$, $T_C$ and $T_D$. Each of the portions 64a–d has a heat flow path with a distinct total surface area contacting a portion of bottom surface 43 that is effective to provide the characteristic temperature for material 44 desired in each of temperature zones $T_A$, $T_B$, $T_C$ and $T_D$. In particular and as illustrated in FIG. 6, portion 64b has the largest total surface area and will therefore provide the greatest heat transfer of the four portions 64a–d. Portion 64d has the least total surface area and will therefore provide the smallest heat transfer among the four portions 64a–d. The surface area of each of the portions 64a,c–d is defined by the respective collective surface area of the topmost surfaces of a plurality of projections 66a,c–d, respectively. Although portion 64b does not include projections and presents a continuous planar surface, the present invention is not so limited in that portion 64b may also include a set of projections.

As illustrated in FIG. 6, the projections 66a,c–d may have the form of a rectangular grid of ribs separated by a plurality of corresponding rectangular depressions or recesses. The surface area of each of the uppermost surfaces of projections 66a,c–d and the spacing between adjacent ones of the projections 66a,c–d will determine the respective total surface areas in portions 64a,c–d of support block 48. The projections 66a,c–d may be formed by any suitable process, such as by wet chemical etching. It is appreciated that the projections 66a,c–d may assume different forms, such as a plurality of non-interconnected mesas, or any other form apparent to persons of ordinary skill in the art. It is further appreciated that the cross-sectional area of the projections 66a,c–d may be varied along the length of the respective flow paths, such as tapering, to change the associated conductive heat transfer.

While FIGS. 5 and 6 depict non-uniform conductive heat transfer to the substrate 34, it is contemplated by the invention that heat may be conducted non-uniformly to the die 32 to provide the same advantages.

Figure 7:
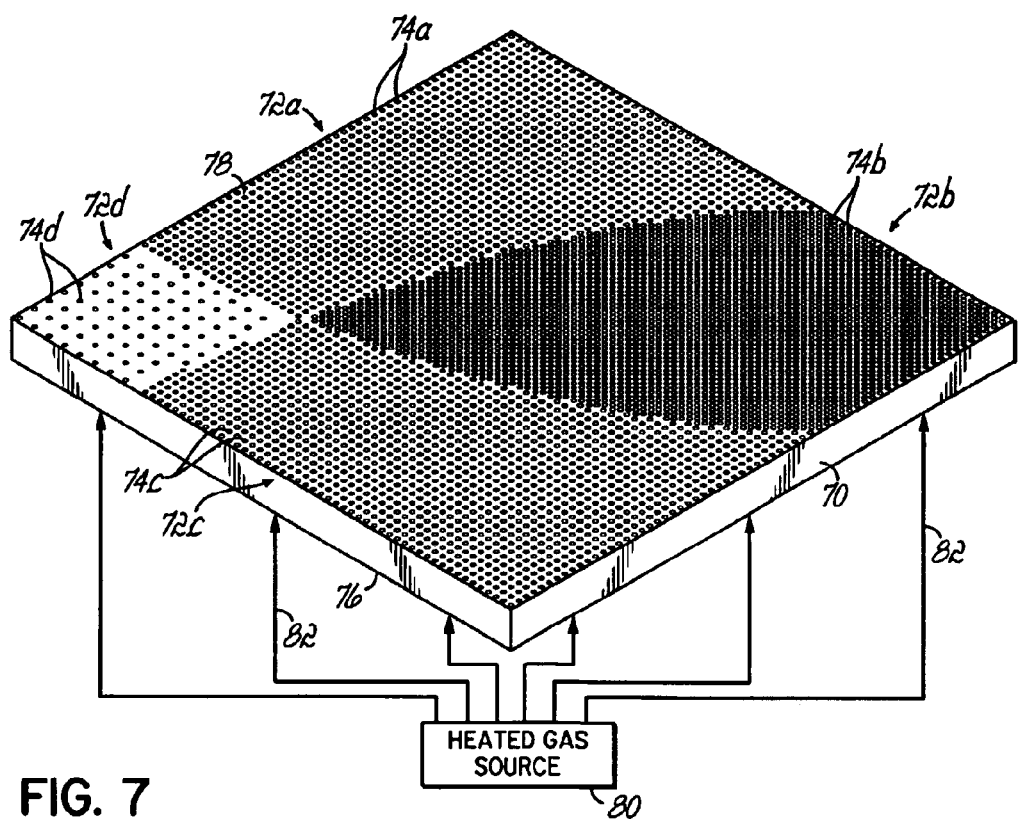
FIG. 7 is a perspective view of a heating block according to the present invention for transferring heat by convection to a substrate during an underfilling operation to provide the temperature zones of FIG. 4.

With reference to FIG. 7 and in accordance with another embodiment of the invention, a support plate or block 70 is shown that operates to transfer heat by convection to the substrate 34 (not shown) and, subsequently, from the substrate 34 to the encapsulant material 44 (FIGS. 2, 3) moving into the gap 40 (FIG. 3) during an underfilling operation. The support block 70 includes four portions 72a–d each of which corresponds to one of the temperature zones $T_A$, $T_B$, $T_C$ and $T_D$. Extending from a lower surface 76 to an upper surface 78 of the support block 70 in each of the four portions 72a–d is a corresponding set of through holes or perforations 74a–d. The perforations 74a–d are drilled or machined in the support block 70 by laser drilling or conventional drilling, or may be formed by other processes, including selective chemical or plasma etching.

To that end, adjacent ones in each set of perforations 74a–d are arranged with a spaced-apart relationship to provide an ordered arrangement, such as a grid or array, or may be arranged in a random pattern. Uniform heat transfer within the temperature zones $T_A$, $T_B$, $T_C$ and $T_D$ is typically desired and would likely result from ordered arrangements. Each portion 72a–d of the support block 70 is characterized by a porosity given by the ratio of the total cross-sectional area of the respective set of perforations 74a–d to surface area of the remaining unperforated part of the support block 70. The porosity of each portion 72a–d of the support block 70 is characterized by, among other parameters, the number of perforations 74a–d, the pattern of perforations 74a–d, the geometrical shape of each perforation 74a–d, and the average pore diameter of each perforation 74a–d. Typically, the ratio of the total cross-sectional area of the perforations 74a–d to the surface area of the remaining unperforated part of the corresponding portion 72a–d ranges from 10% to about 90%. The perforations 74a–d may have a cylindrical configuration with a circular cross-sectional profile or other cross-sectional profiles, such as polygonal, elliptical or slotted. The perforations 74a–d may have a single, uniform cross-sectional area or may have a distribution of cross-sectional areas.

A heated gas source 80 provides a forced flow of heated gas, represented by arrows 82, directed toward the lower surface 76 of the support plate 70. The flow 82 of heated gas has a spatially uniform temperature and a spatially uniform volumetric flow rate, although the present invention is not so limited, over the entire surface area of the lower surface 76. The heated gas source 80 may comprise, for example, a heating element and a blower operative to direct gas past the heating element generate a flow of heated gas. The porosity of the various portions 72a–d of support block 70 is operative to regulate the convective fluid communication between the forced flow 82 of heated gas from heated gas source 80 to the lower surface 43 of substrate 34, wherein the upper surface 78 of support block 70 either supports substrate 34 as shown or is spaced a short distance from lower surface 43 of substrate 34. Specifically, the differing porosities of the portions 72a–d of support block 70 determine the passage of the flow of heated gas and, as a result, the convective transfer of heat energy that elevates the temperature of the substrate 34. Portions of support block 70 having greater porosity will transfer or transmit heated gas in a distributed flow with a flow rate effective to cause a greater rise in temperature in corresponding portions of substrate 34. As illustrated in FIG. 7, for example, the porosity of portion 74b is larger than the porosity of portion 74d so that more heat energy will be convectively transferred by the flow of heated gas through portion 74b than the flow of heated gas through portion 74d. The porosity in each of portions 74a–d is effective to provide the corresponding characteristic temperature of encapsulant material 44 in each of the associated temperature zones $T_A$, $T_B$, $T_C$ and $T_D$.

Figure 8:
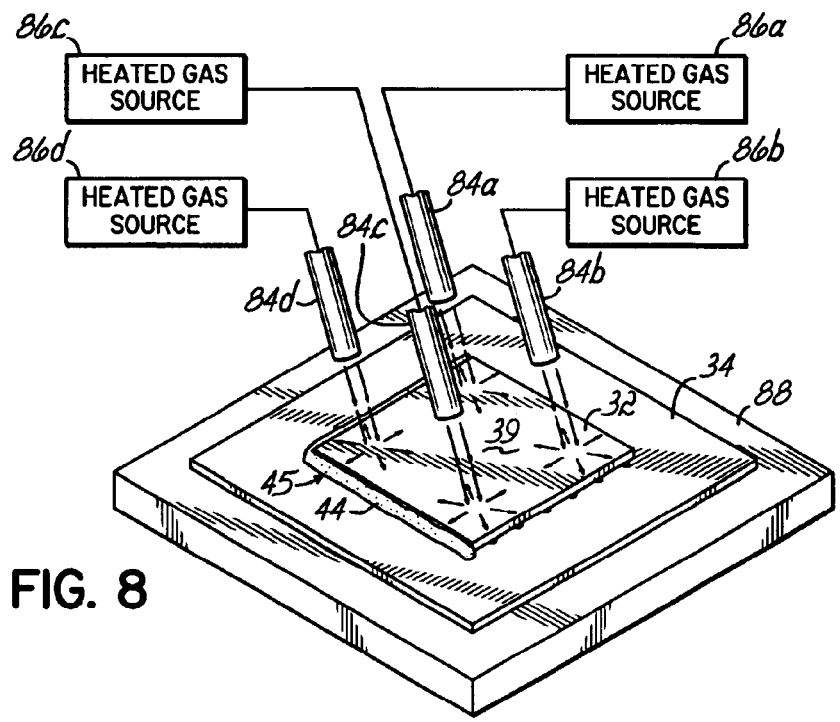
FIG. 8 is a perspective view of a non-contact arrangement to the present invention for transferring heat by convection to a die during an underfilling operation to provide the temperature zones of FIG. 4.

With reference to FIG. 8 and in accordance with another embodiment of the invention, a plurality of, for example, four heat nozzles 84a–d are mounted to be able to deliver individual flows of heated gas for convectively heating respective regions of die 32 to provide heat energy for subsequent transfer from the die 32 to the encapsulant material 44 (FIGS. 2, 3) moving into the gap 40 (FIG. 3) during an underfilling operation. Each of the heat nozzles 84a–d is continuously supplied a flow of a heated gas, such as heated air, from a respective heated gas source 86a–d. The respective flows of heated gas from heat nozzles 84a–d impinge the upper surface 39 in a manner effective to generate the temperature zones $T_A$, $T_B$, $T_C$ and $T_D$ (FIG. 4). Substrate 34 is supported on a support block 88, which may be heated to a uniform temperature to supplement the heating provided by the heat nozzles 84a–d.

An outlet opening or mouth of each of the heat nozzles 84a–d is oriented so that heated gas impinges a different region of the upper surface 39 of die 32 in which each different portion is correlated with one of the temperature zones $T_A$, $T_B$, $T_C$ and $T_D$. The amount of heat transferred by the heated gas flow of each of heat nozzles 84a–d may be precisely controlled by regulating one or more of the air pressure, the volumetric flow rate, the duration of impingement, the gas temperature, the distance from the mouth of each nozzle 84a–d to the upper surface 39, the lateral position of each nozzle 84a–d relative to upper surface 39, the field of impingement, and the impingement angle of the gas flow relative to a surface normal of upper surface 39. The impingement angle, for example, may be any angle effective to provide convective heat transfer and, generally ranges from about 25° to about 75° with an impingement angle of about 45° being typical, assuming other variable are fixed. In other embodiments of the invention that convectively transfer heat energy to the die 32, a single heat nozzle may be provided that has a plurality of outlets spaced and dimensioned to direct multiple parallel streams of air toward the upper surface 39 of die 32 in a pattern that provides the respective temperature zones $T_A$, $T_B$, $T_C$ and $T_D$.

Figure 9:
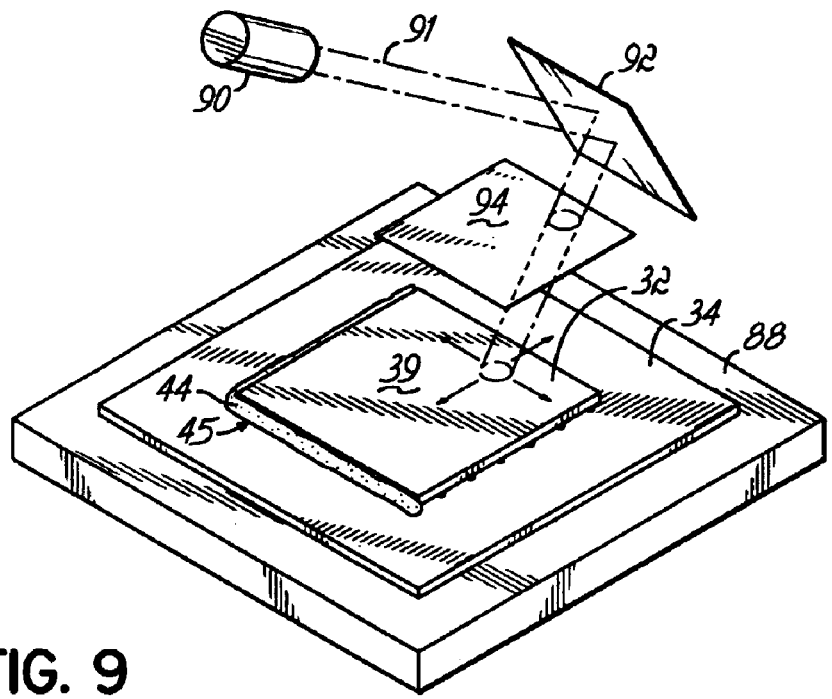
FIG. 9 is a perspective view of a non-contact arrangement according to the principles of the present invention for transferring heat by radiation to a die during an underfilling operation to provide the temperature zones of FIG. 4.

With reference to FIG. 9 and in accordance with another embodiment of the invention, a radiation source, such as a laser 90, is utilized to transfer electromagnetic radiation, represented diagrammatically by reference numeral 91, for heating respective regions of die 32 to provide heat energy for subsequent transfer from the die 32 to the encapsulant material 44 (FIGS. 2, 3) moving into the gap 40 (FIG. 3) during an underfilling operation. Laser 90 is operative to emit radiation 91, typically having a wavelength or range of wavelengths in at least one of the infrared, visible, or ultraviolet portions of the electromagnetic spectrum.

Radiation 91 from laser 90 is reflected by a scanning mirror 92 to irradiate the upper surface 39 of die 32 through a mask 94 interposed in the optical path between the mirror 92 and the die 32. The scanning mirror 92 includes a reflective surface operative to redirect the radiation 91. The scanning mirror 92 is positionable to change the angular relationship between the optical path of radiation 91 from laser 90 to the mirror 92 and the surface normal of mirror 92 so that the beam of radiation 91 can be scanned or rastered laterally in a pattern located within the perimeter of the mask 94 and die 32. The mask 94 allows selective radiation of the upper surface 39 of die 32 by blocking radiation in certain opaque areas and transmitting radiation in other open areas.

An image corresponding to the open and opaque areas of the mask 94 is projected onto the upper surface 39 of die 32. The scanning of radiation 91 is programmed and the pattern of opaque and open areas in mask 94 is controlled so as to transfer heat energy to die 32 in a manner effective to provide temperature zones $T_A$, $T_B$, $T_C$ and $T_D$. The amount of heat transferred by radiation 91 can be controlled, aside from the selective transmission afforded by the mask 94, by varying, among other variables, the scan pattern and the scan rate. It is appreciated that the simplified optical system shown in FIG. 9 may include other conventional optical elements (not shown). In an alternative mask-less embodiment of the invention, laser 90 may be digitally controlled by a conventional digital imaging technique for moving or rastering the radiation 91 laterally across the upper surface 39 of die 32 with dwell times appropriated to provide temperature zones $T_A$, $T_B$, $T_C$ and $T_D$.

Figure 10:
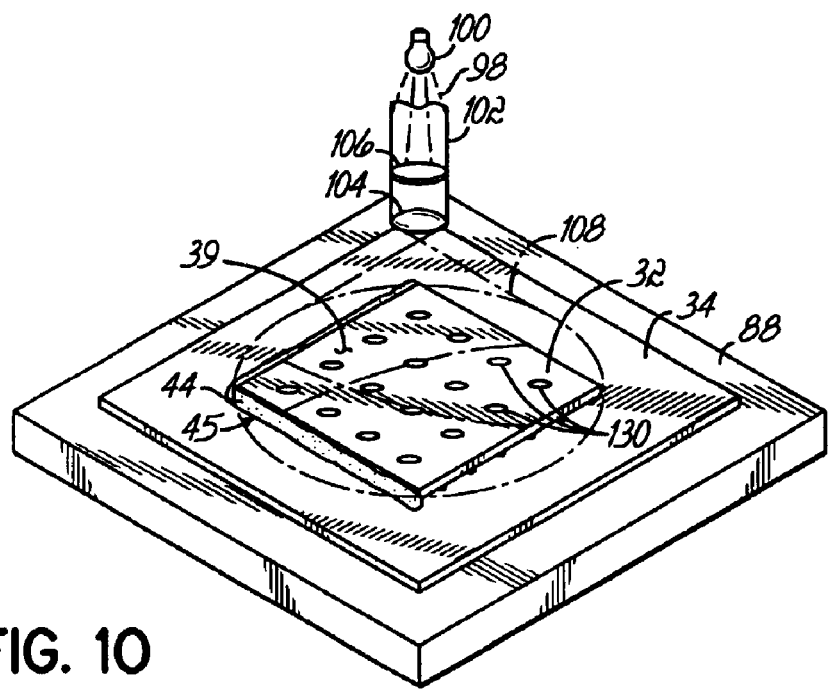
FIG. 10 is a perspective view of a non-contact arrangement to the principles of the present invention for transferring heat by radiation to a die during an underfilling operation to provide the temperature zones of FIG. 4.

With reference to FIG. 10 and in accordance with another embodiment of the present invention, electromagnetic radiation, represented diagrammatically by reference numeral 98, originating from a radiation source, such as a lamp 100, is directed in an optical path through an optical coupling, such as light guide 102, to the die 32 and allowed to irradiate upper surface 39. The light guide 102 had a light-emitting outlet suspended in a fixed position at a given distance above upper surface 39 of die 32. The light guide 102 also includes a focusing element 104 and a mask 106 that allows selective radiation of the upper surface 39 of die 32 by blocking radiation from lamp 100 in certain opaque areas and transmitting radiation from lamp 100 in other open areas.

An image 108 of mask 106 is projected onto the upper surface 39 that is effective to radiatively transfer heat energy to provide temperature zones $T_A$, $T_B$, $T_C$ and $T_D$. In addition to the selective transmission afforded by the mask 106, the intensity of the radiation 98 from lamp 100 can varied for controlling the transfer of heat energy. Typically, the intensity of the radiation 98 is spatially-uniform before acted upon by the mask 106 but the invention is not so limited. It is appreciated that other radiation source arrangement, such as an array of lamps, may be substituted for lamp 100 without departing from the spirit and scope of the present invention. The wavelength of the electromagnetic radiation 98 is typically in the infrared range of the electromagnetic spectrum but the present invention is not so limited in that a variety of radiation-emitting sources can be used in the present invention. It is appreciated that the simplified optical system shown in FIG. 10 may include other conventional optical elements (not shown).

Figure 11:
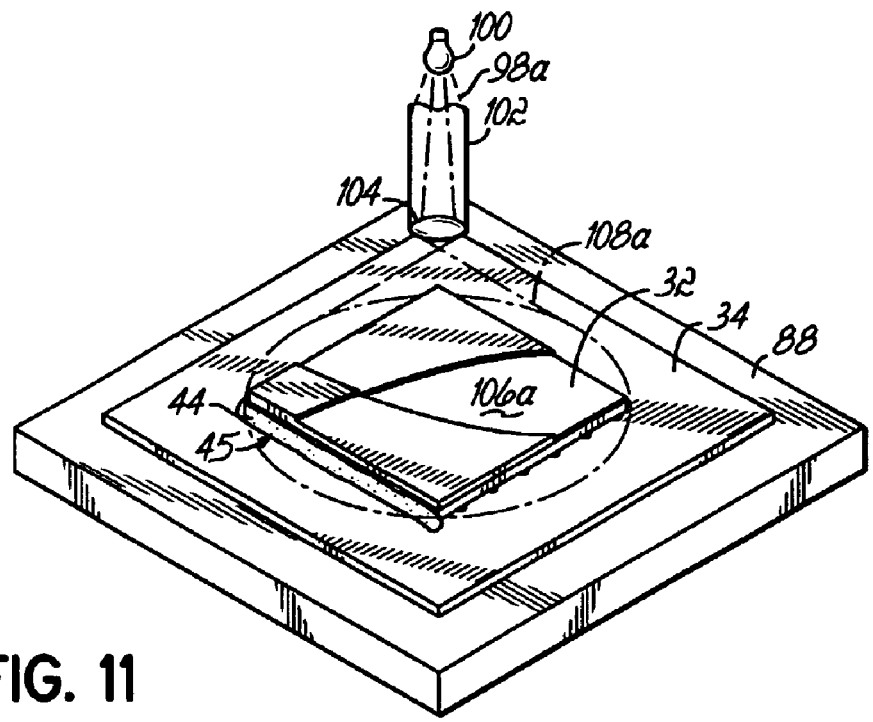
FIG. 11 is a perspective view of a non-contact arrangement to the principles of the present invention for transferring heat by radiation to a die during an underfilling operation to provide the temperature zones of FIG. 4.

In an alternative embodiment and with reference to FIG. 11 in which like reference numerals refer to like features in FIG. 10, a thermal transfer element 106a may be positioned directly on the upper surface 39 of die 32 and exposed to a spatially uniform flux of radiation 98a originating from the lamp 100. Thermal transfer element 106a may be substituted for mask 106 relied upon in the embodiment of the present invention described with regard to FIG. 10, as is illustrated in FIG. 11, or may replace the mask 94 relied upon in the embodiment of the present invention described with regard to FIG. 9.

Thermal transfer element 106a is operative for absorbing radiation 98a in the uniformly-distributed image 108a originating from lamp 100 and converting the radiative energy into heat energy that is subsequently transferred by conduction from element 106a to the die 32 and, thereafter, to the encapsulant material 44 moving into gap 40. To that end, thermal transfer element 106a is formed of a thermally-conductive material having a pattern of thicknesses that varies so as to alter the path length for heat conduction. Different portions of thermal transfer element 106a have a thickness appropriate to retard thermal conduction so as to provide temperature zones $T_A$, $T_B$, $T_C$ and $T_D$. A thermally-conductive material suitable for use in forming thermal transfer element 106a is available commercially under the SIL-PAD® tradename from the Bergquist Company (Chanhassen, Minn.).

While FIGS. 9, 10 and 11 depict non-uniform radiative heat transfer to the die 32, it is contemplated by the invention that heat may be radiated non-uniformly to the substrate 34 to provide the same advantages.

Figure 12:
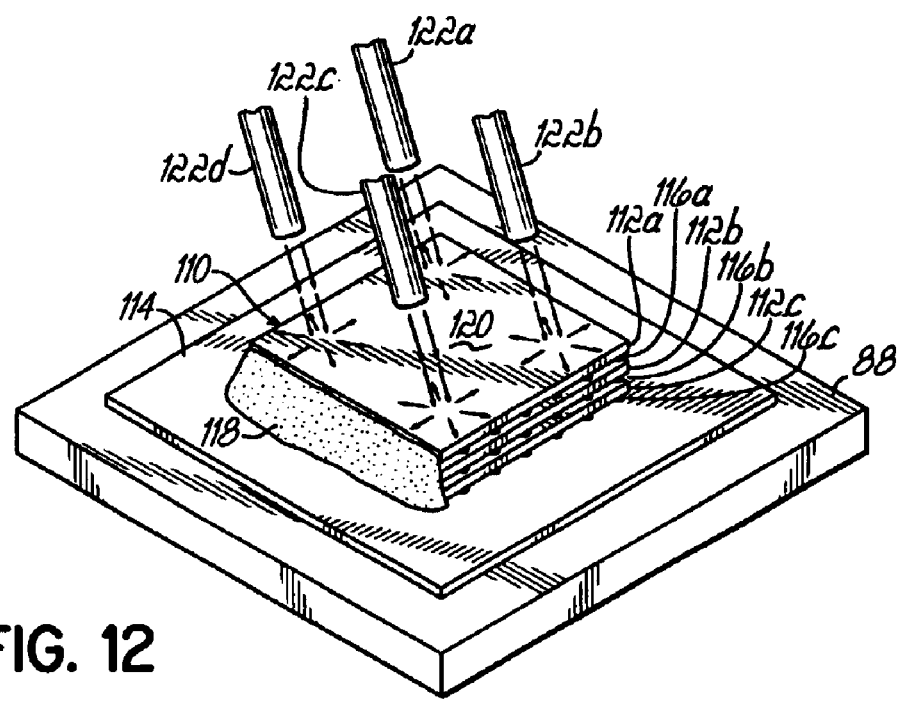
FIG. 12 is a perspective view of a non-contact arrangement according to the principles of the present invention for transferring heat by convection to a stacked die package during an underfilling operation to provide the temperature zones of FIG. 4.

With reference to FIG. 12, a stacked die package 110 is illustrated that consists of a plurality of, for example, three individual dies 112a–c mounted in a vertical arrangement to a substrate 114. Present between dies 112a and 112b and between dies 112b and 112c are corresponding gaps 116a and 116b created by electrical interconnections. Another gap 116c, created by electrical connections, is present between die 112c and substrate 114. A bead of encapsulant material 118 adjacent to at least one side edge of the stacked die package 110 and is subsequently moved into the gaps 116a–c. According to the principles of the present invention, the movement of the encapsulant material 118 into gaps 116a–c can be controlled by transferring heat energy to an upper surface 120 of die 112a in an amount effective to create the temperature zones $T_A$, $T_B$, $T_C$ and $T_D$ (FIG. 4). Heat is transferred convectively using a plurality of heat nozzles 122a–d and in a manner described above with regard to FIG. 8. However, it is appreciated that the transfer of heat may be accomplished in accordance with any of the various specific embodiments of the present invention, including those described with regard to FIGS. 5–7 and 9–10, without departing from the spirit and scope of the present invention.

Figure 13:
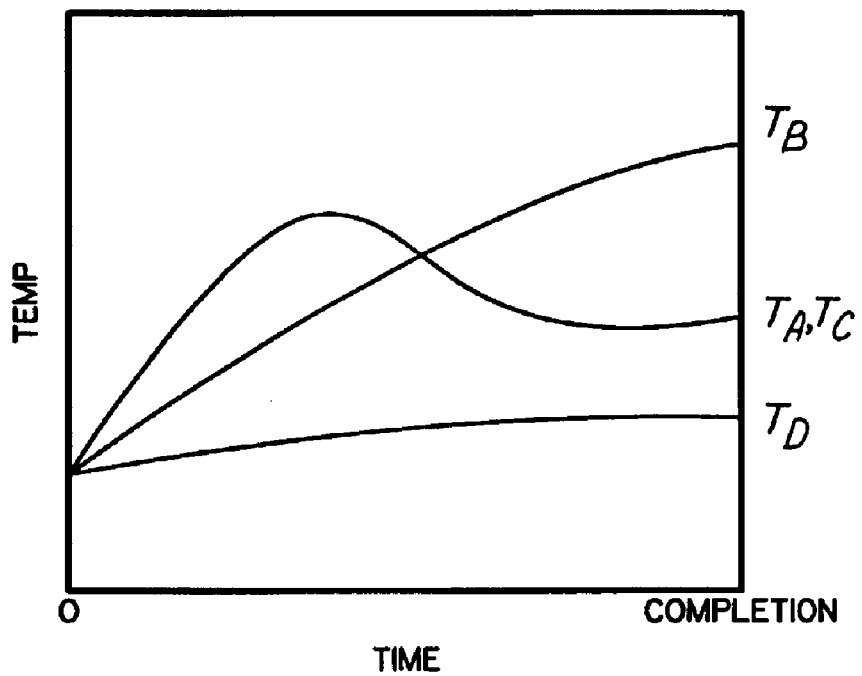
FIG. 13 is a graphical representation of dynamic variation of the temperatures in the temperature zones of FIG. 4 according to the cumulative time for completing an underfilling operation.
Figure 14:
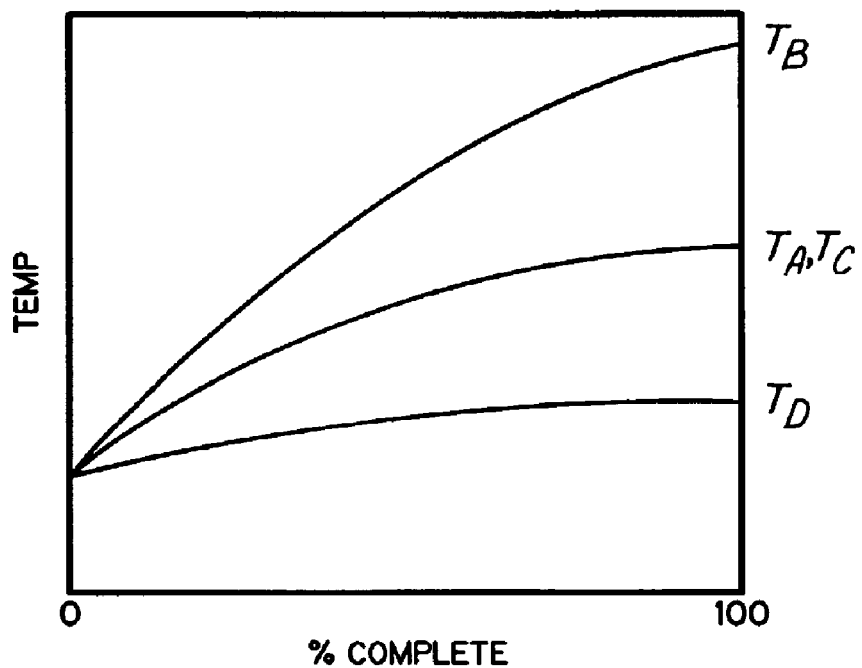
FIG. 14 is a graphical representation of dynamic variation of the temperatures in the temperature zones of FIG. 4 according to the completion percentage of an underfilling operation.

With reference to FIGS. 13 and 14 and in accordance with another aspect of the present invention, the temperatures of each of the temperature zones $T_A$, $T_B$, $T_C$ and $T_D$ (FIG. 4) may be dynamically varied or modulated during an underfilling operation as a function of time or percentage of completion. It is appreciated that the temperature variations are tailored according to the need of an individual underfilling operation and are not limited by the specific embodiments of the present invention illustrated in FIGS. 13 and 14.

FIG. 13 depicts one specific embodiment in which the temperature in each of the temperature zones $T_A$, $T_B$, $T_C$ and $T_D$ is modulated as a function of time. It is apparent that the temperature zones $T_A$, $T_B$, $T_C$ and $T_D$ are initially at a uniform temperature. As the underfilling operation initiates, heat is transferred to increase the temperature of the underfill material in each of the corresponding temperature zones $T_A$, $T_B$, $T_C$ and $T_D$. Early in the underfilling operation, the heat flux is greatest in temperature zones $T_A$ and $T_C$ that correspond to regions in the gap near the corners of the gap for which stagnation would otherwise be observed. After the corners are substantially underfilled as the underfilling operation progresses, the heat flux in temperature zones $T_A$ and $T_C$ is reduced so that the temperature of the encapsulant material drops in those zones. The smallest heat flux is transferred in temperature zone $T_D$ in which the temperature of the encapsulant material increases with a modest ramp rate as the underfilling operation progresses toward completion. The heat flux provided to temperature zone $T_B$ increases with a relative large ramp rate so that, as the underfilling operation nears completion, the temperature of the encapsulant material in the corresponding region of the gap is significantly hotter than in regions corresponding to others of the zones.

FIG. 14 depicts another specific embodiment in which the temperature in each of the temperature zones $T_A$, $T_B$, $T_C$ and $T_D$ is varied as a function of percentage of completion of the underfilling operation. It is apparent that the temperature of each of the temperature zones $T_A$, $T_B$, $T_C$ and $T_D$, and the encapsulant material therein, is ramped upwardly as the underfilling operation progresses toward completion. To indicate the progress of the underfilling operation, a sensor or sensors 130 (FIG. 10) is provided for detecting the position of the wave front of the encapsulant material 44 (FIG. 2) through the gap 40 between the die 32 and the substrate 34. The sensor 130 is any suitable device known to persons of ordinary skill in the art operative for detecting the position of the wave front and may include capacitive sensors. The sensor 130 provides a feedback control signal to a process controller (not shown) regulating the transfer of heat energy to the encapsulant material 44.

The transfer of additional heat energy as the underfilling operation proceeds, as depicted in FIGS. 13 and 14, allows the temperature in each of the temperature zones $T_A$, $T_B$, $T_C$ and $T_D$ to be increased without concern of gelling or clogging to which the underfilling operation would otherwise be susceptible if high heat transfers were applied during the entire underfilling operation.

In use to perform an underfilling operation, a heat source operative to provide a heat gradient for encapsulant material 44 entering gap 40 is provided as illustrated by one of the various embodiments of the present invention shown in FIGS. 5–13. A bead of encapsulant material 44 is dispensed from underfill dispenser 35 onto the substrate 34 adjacent to one or more side edges of the die 32. A pressure differential may be created across the bead of encapsulant material 44 to assist capillary action for moving material 44 into the gap 40. A heat source, such as those illustrated in FIGS. 5–13, is employed to heat one of the die 32 and the substrate 34 to establish the temperature gradient of temperature zones $T_A$, $T_B$, $T_C$ and $T_D$. As the encapsulant material 44 moves into the gap 40, material 44 in regions of the gap 40 corresponding to each of the temperature zones $T_A$, $T_B$, $T_C$ and $T_D$ absorbs heat energy transferred by conduction from either the die 32 or the substrate, depending upon which is heated by the heat source, and the temperature rises proportionate to the amount of transferred heat in each zone. Heating the encapsulant material 44 in regions of the gap 40 to establish the characteristic temperature corresponding to each of the temperature zones $T_A$, $T_B$, $T_C$ and $T_D$ is effective to provide a more uniform wave front as the material 44 fills the gap 40. The uniformity of the wave front of encapsulant material 44 afforded by the principles of the present invention promotes the rapid completion of the underfilling operation and also significantly reduces or prevents the occurrence of voids.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. For example, while the various non-uniform heating methods are illustrated as being used individually, it will be appreciated that certain of the heating methods may be combined and used simultaneously to non-uniformly transfer heat to the encapsulant material during an underfilling operation. Accordingly, departures may be made from such details without departing from the spirit or scope of applicants' general inventive concept.

We claim:

1. A method of underfilling a gap between a multi-sided die and a substrate to encapsulate a plurality of electrical connections extending therebetween, comprising:
    dispensing an encapsulant material onto the substrate adjacent to at least one side edge of the die; and
    providing heat energy non-uniformly from one of the die and the substrate to the encapsulant material moving in the gap to direct movement of the encapsulant material in the gap.

2. The method of claim 1 wherein the step of providing heat energy further comprises providing the heated one of the die and substrate with a plurality of temperature zones distributed to promote non-uniform heating of the encapsulant material.

3. The method of claim 1 further comprising transferring heat energy conductively to the heated one of the die and the substrate for subsequent transfer to the encapsulant material during the step of providing heat energy.

4. The method of claim 1 further comprising transferring heat energy convectively to the heated one of the die and the substrate for subsequent transfer to the encapsulant material during the step of providing heat energy.

5. The method of claim 1 further comprising transferring heat energy radiatively to the heated one of the die and the substrate for subsequent transfer to the encapsulant material during the step of providing heat energy.

6. The method of claim 1 wherein the step of providing heat energy is performed before the step of dispensing.

7. The method of claim 1 wherein the step of providing heat energy is performed after the step of dispensing.

8. The method of claim 1 wherein the step of providing heat energy is performed simultaneously with the step of dispensing.

9. A method of underfilling a gap between a multi-sided die and a substrate to encapsulate a plurality of electrical connections extending therebetween, comprising:
    dispensing an encapsulant material onto the substrate adjacent to at least one side edge of the die;
    heating one of the die and the substrate to generate a temperature gradient;
    moving the encapsulant material in the gap for encapsulating the plurality of electrical interconnections; and
    transferring heat energy from the heated one of the die and substrate to the moving encapsulant material in a pattern determined by the temperature gradient for selectively varying the flow of the moving encapsulant material in the gap.

10. The method of claim 9 wherein the step of heating further comprises coupling a support block in conductive thermal communication with the substrate to provide a conductive transfer path to the substrate.

11. The method of claim 10 wherein the support block is heated to a uniform temperature and the temperature gradient is established by selectively varying an area of the conductive transfer path between the substrate and the heated support block.

12. The method of claim 10 wherein the step of heating further comprises heating a first portion of the support block to a first temperature, and heating a second portion of the support block to a second temperature differing from the first temperature.

13. The method of claim 9 wherein the temperature gradient is established by providing a plurality of temperature zones each having a characteristic temperature.

14. The method of claim 13 wherein the characteristic temperature in each of the plurality of temperature zones is varied as the encapsulant material moves in the gap.

15. The method of claim 9 wherein the step of heating further comprises varying the temperature gradient as the encapsulant material flows in the gap.

16. The method of claim 9 further comprising the steps of:
detecting a position of a leading edge of the moving encapsulant material; and
varying the temperature gradient according to the position of the leading edge of the moving encapsulant material.

17. The method of claim 9 wherein the step of heating further comprises positioning a perforated support block adjacent to the substrate, and directing a flow of a heated gas through the perforations in the support block to transfer heat convectively to the substrate.

18. The method of claim 17 wherein the perforations have a distribution of sizes operative to establish the temperature gradient.

19. The method of claim 9 wherein the step of heating further comprises providing a flow of a heated gas to impinge the die.

20. The method of claim 19 further comprising moving the flow of the heated gas relative to the die.

21. The method of claim 19 further comprising moving the die and the substrate relative to the flow of the heated gas.

22. The method of claim 9 wherein the step of heating further comprises exposing the die to a radiative flux of electromagnetic energy.

23. The method of claim 22 wherein the step of exposing further comprises directing a radiative flux through a mask having a pattern of openings configured to establish the temperature gradient.

24. The method of claim 22 wherein the step of exposing further comprises moving an area of radiative flux dimensionally smaller than a surface area of the die relative to the die in a manner operative to establish the temperature gradient.

25. The method of claim 22 further comprising covering the die with a thermal transfer element formed of a thermally-conductive material having a pattern of thicknesses that varies so as to alter the path length for heat conduction, and the step of exposing further comprises absorbing the radiative flux with the thermal transfer element to establish the temperature gradient.

26. An apparatus for underfilling a gap between a multi-sided die and a substrate with a dispenser operative for dispensing an encapsulant material adjacent to at least one side edge of the die to encapsulate a plurality of electrical connections formed therebetween, comprising:
a heat source operative to transfer heat energy to first and second regions of one of the die and the substrate so that said first and second regions are heated to respective first and second temperatures, the first temperature differing from the second temperature so as to non-uniformly transfer heat to the encapsulant material moving in the gap between the multi-sided die and the substrate.

27. The apparatus of claim 26 wherein said heat source is a support block having a first portion coupled in conductive thermal communication with the substrate proximate said first region and a second portion coupled in conductive thermal communication with the substrate proximate said second region.

28. The apparatus of claim 27 wherein said support block is heated to a uniform temperature, said first portion having a first surface area in contact with the first region of the substrate, and said second portion having a second surface area in contact with the second region of the substrate, said first surface area differing from said second surface area.

29. The apparatus of claim 27 further comprising:
a first heating element thermally coupled with said support block, said first heating element operative to transfer heat to said first portion of said support block to provide the first temperature in said first region of the substrate; and
a second heating element thermally coupled with said support block, said second heating element operative to transfer heat to said second portion of said support block to provide the second temperature in said second region of the substrate.

30. The apparatus of claim 26 wherein said heat source is operative to provide a radiative flux of electromagnetic energy.

31. The apparatus of claim 30 wherein said heat source further comprises a mask having a pattern of openings configured to establish the temperature gradient.

32. The apparatus of claim 30 wherein said heat source comprises a laser providing an area of radiative flux dimensionally smaller than a surface area of the die and a reflective device for moving the area of radiative flux relative to the die in a manner operative to establish the temperature gradient.

33. The apparatus of claim 30 further comprising a thermal transfer element covering the die, said thermal transfer element formed of a thermally-conductive material having a pattern of thicknesses that varies so as to alter the path length for heat conduction, and said thermal transfer element operative to absorb said radiative flux to establish the temperature gradient.

34. The apparatus of claim 26 wherein said heat source includes:
a source capable of directing a flow of a heated gas toward the first and second regions of the substrate,
a first porous element positioned between said source and said substrate, said first porous element having a first porosity effective to control the flow of the heated gas to the first region of the substrate so that sufficient heat energy is convectively transferred to heat the first region to the first temperature; and
a second porous element positioned between said source and said substrate, said second porous element having a second porosity effective to control the flow of the heated gas to the second region of the substrate so that sufficient heat energy is convectively transferred to heat the second region to the second temperature, said second porosity differing from said first porosity.

35. The apparatus of claim 26 wherein said heat source includes:
a first nozzle adapted to direct a first flow of heated gas at the first region of the die, said first flow of heated gas convectively transferring heat in an amount effective to provide the first temperature; and
a second nozzle adapted to direct a second flow of heated gas at the second region of the die, said second flow of heated gas convectively transferring heat in an amount effective to provide the second temperature.

36. The apparatus of claim 26 wherein the difference between the first and second temperatures provides a temperature gradient in the gap between the multi-sided die and the substrate.

37. The apparatus of claim 26 wherein said heat source is capable of varying said first and said second temperatures as the encapsulant material moves into the gap between the multi-sided die and the substrate.

38. An apparatus for underfilling a gap between a multi-sided die and a substrate to encapsulate a plurality of electrical connections formed therebetween, comprising:
a dispenser operative for dispensing an encapsulant material adjacent to at least one side edge of the die; and
a heat source operative to transfer heat energy to first and second regions of one of the die and the substrate so that said first and second regions are heated to respective first and second temperatures, the first temperature differing from the second temperature so as to non-uniformly transfer heat to the encapsulant material moving into the gap between the multi-sided die and the substrate.

39. The apparatus of claim 38 wherein said heat source is a support block having a first portion coupled in conductive thermal communication with the substrate proximate said first region and a second portion coupled in conductive thermal communication with the substrate proximate said second region.

40. The apparatus of claim 39 wherein said support block is heated to a uniform temperature, said first portion having a first surface area in contact with the first region of the substrate, and said second portion having a second surface area in contact with the second region of the substrate, said first surface area differing from said second surface area.

41. The apparatus of claim 39 further comprising:
a first heating element thermally coupled with said support block, said first heating element operative to transfer heat to said first portion of said support block to provide the first temperature in said first region of the substrate; and
a second heating element thermally coupled with said support block, said second heating element operative to transfer heat to said second portion of said support block to provide the second temperature in said second region of the substrate.

42. The apparatus of claim 38 wherein said heat source is operative to provide a radiative flux of electromagnetic energy.

43. The apparatus of claim 42 wherein said heat source further comprises a mask having a pattern of openings configured to establish the temperature gradient.

44. The apparatus of claim 42 wherein said heat source comprises a laser providing an area of radiative flux dimensionally smaller than a surface area of the die and a reflective device for moving the area of radiative flux relative to the die in a manner operative to establish the temperature gradient.

45. The apparatus of claim 42 further comprising a thermal transfer element covering the die, said thermal transfer element formed of a thermally-conductive material having a pattern of thicknesses that varies so as to alter the path length for heat conduction, and said thermal transfer element operative to absorb said radiative flux to establish the temperature gradient.

46. The apparatus of claim 44 wherein said heat source includes:
a source capable of directing a flow of a heated gas toward the first and second regions of the substrate,
a first porous element positioned between said source and said substrate, said first porous element having a first porosity effective to control the flow of the heated gas to the first region of the substrate so that sufficient heat energy is convectively transferred to heat the first region to the first temperature; and
a second porous element positioned between said source and said substrate, said second porous element having a second porosity effective to control the flow of the heated gas to the second region of the substrate so that sufficient heat energy is convectively transferred to heat the second region to the second temperature, said second porosity differing from said first porosity.

47. The apparatus of claim 38 wherein said heat source includes:
a first nozzle adapted to direct a first flow of heated gas at the first region of the die, said first flow of heated gas convectively transferring heat in an amount effective to provide the first temperature; and
a second nozzle adapted to direct a second flow of heated gas at the second region of the die, said second flow of heated gas convectively transferring heat in an amount effective to provide the second temperature.

48. The apparatus of claim 38 wherein the difference between the first and second temperatures provides a temperature gradient in the gap between the multi-sided die and the substrate.

49. The apparatus of claim 38 wherein said heat source is capable of varying said first and said second temperatures as the encapsulant material moves into the gap between the multi-sided die and the substrate.

50. A method of underfilling a gap between a multi-sided die and a substrate to encapsulate a plurality of electrical connections extending therebetween, comprising:
dispensing an encapsulant material onto the substrate adjacent to at least one side edge of the die;
heating one of the die and the substrate with a flow of a heated gas to generate a temperature gradient;
moving the encapsulant material in the gap for encapsulating the plurality of electrical interconnections; and
transferring heat energy from the heated one of the die and substrate to the moving encapsulant material in a pattern determined by the temperature gradient for selectively varying the flow of the moving encapsulant material in the gap.

51. The method of claim 50 wherein heating one of the die and the substrate with a flow of a heated gas further comprises:
directing a plurality of flows of heated gas at different regions of the die, said flows of heated gas convectively transferring different amounts of heat to the different regions effective to generate the temperature gradient.

52. An apparatus for underfilling a gap between a multi-sided die and a substrate to encapsulate a plurality of electrical connections formed therebetween, comprising:
a dispenser operative for dispensing an encapsulant material adjacent to at least one side edge of the die; and
a heat source operative to supply a plurality of flows of a heated gas to a plurality of regions of one of the die and the substrate effective to heat the regions to respective different temperatures, the different temperatures of the regions non-uniformly transferring heat to the encapsulant material moving into the gap between the multi-sided die and the substrate.

53. The apparatus of claim 52 wherein the heat source includes a plurality of nozzles each aimed to direct one of the flows of the heated gas at one of the different regions of the die, said flows of heated gas convectively transferring different amounts of heat to the different regions effective to generate a temperature gradient in the encapsulant material.

* * * * *